United States Patent
Marinov et al.

(10) Patent No.: US 12,211,730 B2
(45) Date of Patent: Jan. 28, 2025

(54) DYNAMIC RELEASE TAPES FOR ASSEMBLY OF DISCRETE COMPONENTS

(71) Applicant: KULICKE & SOFFA NETHERLANDS B.V., Eindhoven (NL)

(72) Inventors: Val Marinov, Fargo, ND (US); Yuriy Atanasov, Fargo, ND (US)

(73) Assignee: KULICKE & SOFFA NETHERLANDS B.V., Eindhoven (NL)

( * ) Notice: Subject to any disclaimer, the term of this patent is extended or adjusted under 35 U.S.C. 154(b) by 0 days.

(21) Appl. No.: 17/430,553

(22) PCT Filed: Feb. 14, 2020

(86) PCT No.: PCT/US2020/018262
§ 371 (c)(1),
(2) Date: Aug. 12, 2021

(87) PCT Pub. No.: WO2020/168174
PCT Pub. Date: Aug. 20, 2020

(65) Prior Publication Data
US 2022/0130694 A1    Apr. 28, 2022

Related U.S. Application Data

(60) Provisional application No. 62/843,904, filed on May 6, 2019, provisional application No. 62/806,154, filed on Feb. 15, 2019.

(51) Int. Cl.
*B32B 43/00*    (2006.01)
*H01L 21/67*    (2006.01)
(Continued)

(52) U.S. Cl.
CPC ........ *H01L 21/6836* (2013.01); *B32B 43/006* (2013.01); *H01L 21/67132* (2013.01);
(Continued)

(58) Field of Classification Search
CPC ............. B32B 43/006; Y10T 156/1158; Y10T 156/1916
See application file for complete search history.

(56) References Cited

U.S. PATENT DOCUMENTS 10,170,443 B1    1/2019    Horibe
10,217,637 B1    2/2019    Budd et al.
(Continued)

FOREIGN PATENT DOCUMENTS

EP    0550014    7/1993
EP    0622833    11/1994
(Continued)

OTHER PUBLICATIONS

PCT International Search Report and Written Opinion in International Appln. No. PCT/US2020/018262, dated Jun. 16, 2020, 25 pages.
(Continued)

*Primary Examiner* — Philip C Tucker
*Assistant Examiner* — Nickolas R Harm
(74) *Attorney, Agent, or Firm* — Fish & Richardson P.C.

(57) ABSTRACT

A method includes positioning a discrete component assembly on a support fixture of a component transfer system, the discrete component assembly including a dynamic release tape including a flexible support layer, and a dynamic release structure disposed on the flexible support layer, and a discrete component adhered to the dynamic release tape. The method includes irradiating the dynamic release structure to release the discrete component from the dynamic release tape.

19 Claims, 10 Drawing Sheets

(51) Int. Cl.
*H01L 21/683* (2006.01)
*H01L 21/78* (2006.01)
*H01L 33/00* (2010.01)

(52) U.S. Cl.
CPC ... *B32B 2310/0806* (2013.01); *H01L 21/6838* (2013.01); *H01L 21/78* (2013.01); *H01L 33/0095* (2013.01); *H01L 2221/68322* (2013.01); *H01L 2221/68336* (2013.01); *H01L 2221/68363* (2013.01); *H01L 2221/68368* (2013.01); *H01L 2221/68381* (2013.01); *Y10T 156/1158* (2015.01); *Y10T 156/1961* (2015.01)

(56) References Cited

U.S. PATENT DOCUMENTS

| | | | |
|---|---|---|---|
| 10,381,255 B2 * | 8/2019 | Andry | B32B 43/006 |
| 10,529,614 B2 | 1/2020 | Marinov | |
| 10,748,802 B2 | 8/2020 | Marinov et al. | |
| 11,201,077 B2 | 12/2021 | Marinov et al. | |
| 2002/0076873 A1 | 6/2002 | Spooner et al. | |
| 2004/0048419 A1 * | 3/2004 | Kitamura | H01L 21/3043 |
| | | | 438/464 |
| 2004/0253768 A1 | 12/2004 | Bosman et al. | |
| 2005/0000638 A1 | 1/2005 | Yamamoto | |
| 2005/0003635 A1 | 1/2005 | Takekoshi | |
| 2007/0057410 A1 * | 3/2007 | Chan | H01L 21/67132 |
| | | | 264/482 |
| 2007/0081153 A1 | 12/2007 | Hammond et al. | |
| 2007/0281153 A1 | 12/2007 | Yamamoto | |
| 2010/0022053 A1 | 1/2010 | Mund et al. | |
| 2010/0190293 A1 | 7/2010 | Maeda et al. | |
| 2010/0294423 A1 | 11/2010 | Takesue et al. | |
| 2011/0048630 A1 * | 3/2011 | Hase | H01L 21/67132 |
| | | | 156/941 |
| 2011/0159223 A1 | 6/2011 | Park et al. | |
| 2012/0058289 A1 | 3/2012 | Coates et al. | |
| 2014/0138013 A1 | 5/2014 | Attarawala et al. | |
| 2014/0238592 A1 | 8/2014 | Marinov et al. | |
| 2015/0340265 A1 | 11/2015 | Rudmann et al. | |
| 2015/0357223 A1 | 12/2015 | Takamoto et al. | |
| 2016/0079109 A1 * | 3/2016 | Shima | H01L 21/6836 |
| | | | 438/464 |
| 2016/0133486 A1 * | 5/2016 | Andry | B23K 26/57 |
| | | | 134/1.2 |
| 2017/0313044 A1 | 11/2017 | Marinov et al. | |
| 2017/0365499 A1 | 12/2017 | Marinov | |
| 2018/0218952 A1 | 8/2018 | Horibe et al. | |
| 2019/0057891 A1 | 2/2019 | Marinov | |
| 2019/0311926 A1 * | 10/2019 | Kim | H01L 21/6719 |
| 2019/0348573 A1 | 11/2019 | Raymond et al. | |
| 2020/0023630 A1 | 1/2020 | Sigl et al. | |
| 2020/0075388 A1 * | 3/2020 | Yasuda | H01L 21/6836 |
| 2020/0168498 A1 | 5/2020 | Marinov et al. | |
| 2020/0182923 A1 * | 6/2020 | Kobayashi | H01L 21/67253 |
| 2020/0328143 A1 | 10/2020 | Marinov | |
| 2021/0375649 A1 | 12/2021 | Marinov et al. | |
| 2021/0375659 A1 | 12/2021 | Marinov et al. | |
| 2022/0093423 A1 | 3/2022 | Colosimo et al. | |

FOREIGN PATENT DOCUMENTS

| | | | | |
|---|---|---|---|---|
| JP | 2009260226 | | 11/2009 | |
| JP | 2018231042 A | * | 12/2018 | G01R 31/2601 |
| TW | 201914825 | | 4/2019 | |
| TW | 201940633 | | 10/2019 | |
| WO | WO 1992013363 | | 8/1992 | |
| WO | WO 2013042981 | | 3/2012 | |
| WO | 2012007585 | | 9/2012 | |
| WO | WO2017123780 | | 7/2017 | |
| WO | WO2018231344 | | 12/2018 | |
| WO | WO 2019123901 | | 6/2019 | |
| WO | WO 2020051410 | | 3/2020 | |
| WO | WO 2020252161 | | 12/2020 | |
| WO | WO 2021126580 | | 6/2021 | |

OTHER PUBLICATIONS

Marinov et al., "Laser-assisted ultrathin die packaging: Insights from a process study," Microelectronic Engineering, 2013, 101:23-30.

Supplementary European Search Report in European Application No. EP 20 75 5894, dated Sep. 30, 2022, 8 pages.

PCT International Preliminary Report on Patentability in International Appln. No. PCT/US2020/063609, dated Jun. 30, 2022, 14 pages.

PCT International Search Report and Written Opinion in International Appln. No. PCT/US2020/063609, dated Apr. 9, 2021, 19 pages.

PCT International Preliminary Report on Patentability in International Appln. No. PCT/US2020/018262, dated Aug. 26, 2021, 20 pages.

* cited by examiner

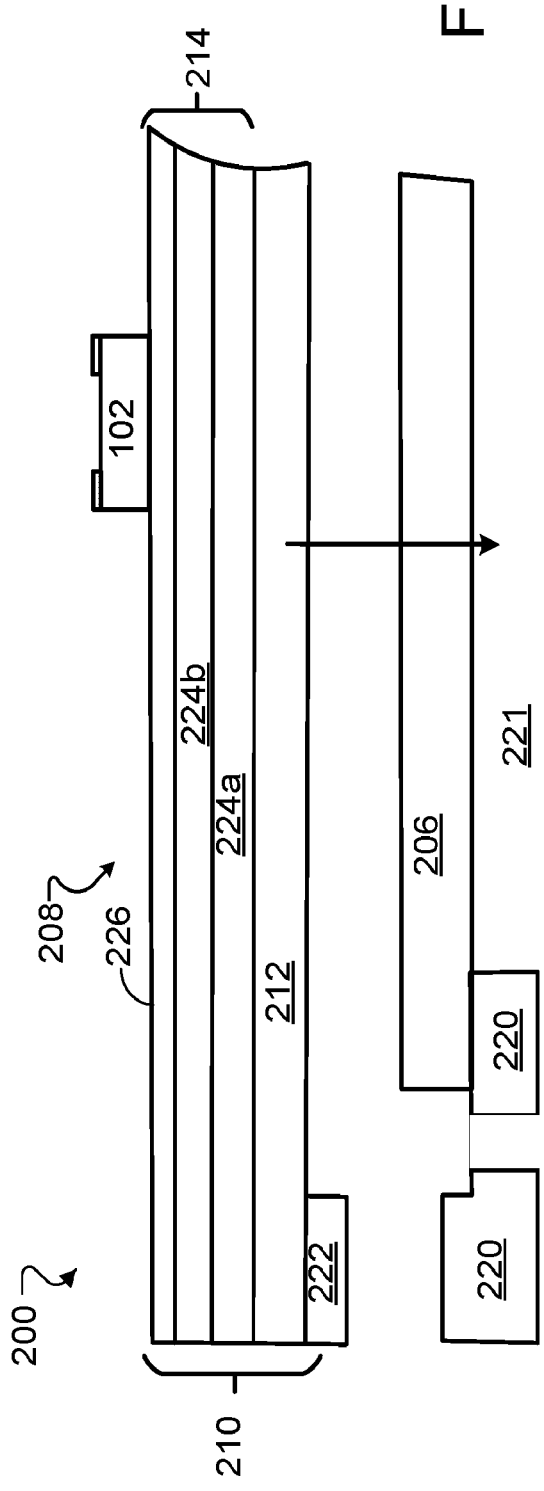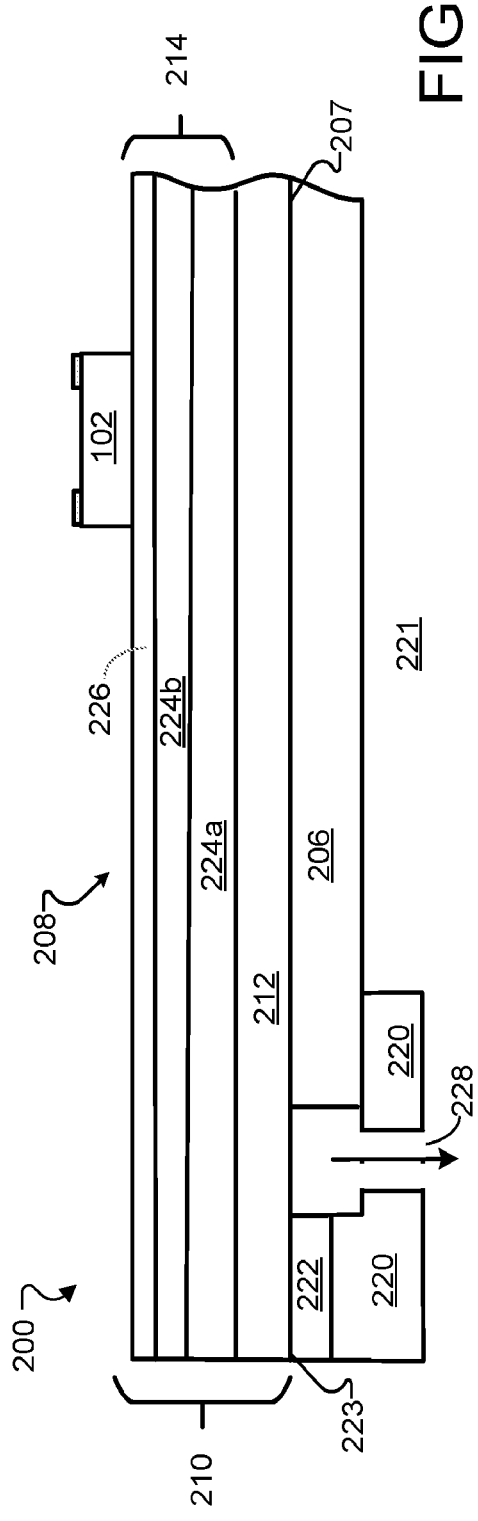

DYNAMIC RELEASE TAPES FOR ASSEMBLY OF DISCRETE COMPONENTS

CLAIM OF PRIORITY

This application is a U.S. National Phase application under 35 U.S.C. § 371 of International Patent Application No. PCT/US2020/018262, filed on Feb. 14, 2020, which claims priority to U.S. Patent Application Ser. No. 62/843,904, filed on May 6, 2019, and to U.S. Patent Application Ser. No. 62/806,154, filed on Feb. 15, 2019, the contents of both which are incorporated here by reference in their entirety.

This invention was made with government support under Grant #1632387 awarded by the National Science Foundation. The government has certain rights in the invention.

BACKGROUND

This description relates generally to assembling discrete components onto a substrate.

SUMMARY

In an aspect, a method includes positioning a discrete component assembly on a support fixture of a component transfer system, the discrete component assembly including: a dynamic release tape including: a flexible support layer, and a dynamic release structure disposed on the flexible support layer, and a discrete component adhered to the dynamic release tape; and irradiating the dynamic release structure to release the discrete component from the dynamic release tape, in which at least a portion of the flexible support layer is free-standing when the discrete component assembly is positioned on the support fixture.

Embodiments can have one or more of the following features.

Positioning the discrete component assembly on the support fixture includes mounting a wafer ring of the discrete component assembly on a frame of the support fixture.

The method includes adhering the discrete component to the dynamic release tape. Adhering the discrete component to the dynamic release tape includes adhering the discrete component to a component adhesion layer of the dynamic release structure. Adhering the discrete component to the dynamic release tape includes transferring the discrete component from a dicing tape to the dynamic release tape.

The method includes adhering a wafer to the dynamic release tape. Adhering the wafer to the dynamic release tape includes adhering the wafer to a component adhesion layer of the dynamic release structure. The method includes dicing the adhered wafer to form discrete components. Positioning the discrete component assembly on the transparent support plate includes attaching the dynamic release tape including the discrete components to a support plate of the support fixture. Positioning the discrete component assembly on the support plate includes holding the discrete component assembly on the support plate by application of a suction.

Irradiating the dynamic release structure includes irradiating the dynamic release structure with light from a light source of the component transfer system.

In an aspect, a method includes positioning a discrete component assembly on a support fixture of a component transfer system, the discrete component assembly including: a dynamic release tape including: a flexible support layer, and a dynamic release structure disposed on the flexible support layer, and a discrete component adhered to the dynamic release tape; in which positioning the discrete component assembly on the support fixture includes positioning the flexible support layer of the dynamic release tape directly on a support plate of the support fixture; and irradiating the dynamic release structure to release the discrete component from the dynamic release tape.

Embodiments can have one or more of the following features.

Positioning the discrete component assembly on the support fixture includes mounting a wafer ring of the discrete component assembly on a frame of the support fixture.

The method includes irradiating the dynamic release structure through the support plate to release the discrete component from the dynamic release tape. The method includes orienting the component transfer system such that the discrete component is positioned between the support plate and a target substrate.

Positioning the discrete component assembly on a support plate includes positioning the discrete component assembly on a rigid support plate.

Positioning the discrete component assembly on the support fixture includes attaching the flexible support layer directly to the support plate.

Positioning the discrete component assembly on the support plate includes holding the discrete component assembly on the support plate by application of a suction.

Positioning the discrete component assembly on the support plate includes stretching the dynamic release tape over the support plate.

The method includes adhering the discrete component to the dynamic release tape. Adhering the discrete component to the dynamic release tape includes adhering the discrete component to a component adhesion layer of the dynamic release structure. Adhering the discrete component to the dynamic release tape includes transferring the discrete component from a dicing tape to the dynamic release tape.

The method includes adhering a wafer to the dynamic release tape. Adhering the wafer to the dynamic release tape includes adhering the wafer to a component adhesion layer of the dynamic release structure. The method includes dicing the adhered wafer to form discrete components. Positioning the discrete component assembly on the transparent support plate includes attaching the dynamic release tape including the discrete components to a support plate of the support fixture. Positioning the discrete component assembly on the support plate includes holding the discrete component assembly on the support plate by application of a suction.

Irradiating the dynamic release structure includes irradiating the dynamic release structure with light from a light source of the component transfer system.

In an aspect, a discrete component transfer system includes a light source; a discrete component support fixture including: a support frame; a support plate positioned on the support frame, the support plate being transparent to light emitted by the light source; and an optical element disposed between the light source and the support frame.

Embodiments can have one or more of the following features.

The system includes a suction source configured to apply a suction to the air flow channel of the discrete component support fixture to hold a flexible support layer of a discrete component assembly against the support plate.

The system includes a discrete component assembly including: a dynamic release tape including a flexible support layer, and a dynamic release structure disposed on the flexible support layer; and a discrete component adhered to the dynamic release tape; and in which the flexible support layer of the dynamic release tape is positioned directly on the support plate and held in place by suction through an air flow channel of the discrete component support fixture. The air flow channel is formed through a thickness of the support frame. The air flow channel is formed through a thickness of the support plate.

A top surface of the support plate is misaligned from a top surface of the support frame by an amount sufficient to introduce a tensile stress in a dynamic release tape held on the discrete component support fixture.

The support plate includes a glass plate.

The support plate includes a quartz plate.

The support plate is rigid.

The optical element includes a lens.

In an aspect, a discrete component transfer system includes a light source; a discrete component support fixture; a discrete component assembly disposed on the discrete component support fixture, the discrete component assembly including: a dynamic release tape including a flexible support layer and a dynamic release structure disposed on the flexible support layer, and a discrete component adhered to the dynamic release tape, in which the dynamic release tape is freestanding when the discrete component assembly is disposed on the discrete component support fixture; and an optical element disposed between the light source and the discrete component assembly.

Embodiments can include one or more of the following features.

The discrete component assembly includes a wafer ring disposed on the discrete component support fixture.

In an aspect, a method includes dicing a wafer adhered to a dicing tape to form discrete components; transferring the discrete components from the dicing tape to a dynamic release tape to form a discrete component assembly, including: a flexible support layer, and a dynamic release structure disposed on the flexible support layer; and positioning the flexible support layer of the discrete component assembly directly on a support plate of a component transfer system.

Embodiments can include one or more of the following features.

Transferring the discrete components to the dynamic release tape includes adhering the discrete components to a component adhesion layer of the dynamic release structure.

The dynamic release structure of the dynamic release tape includes multiple layers. The dynamic release structure includes an active layer structure and a component adhesion layer, in which adhering the wafer to the dynamic release tape includes adhering the wafer to the component adhesion layer.

Positioning the flexible support layer directly on the support plate includes attaching the flexible support layer directly to the support plate.

Positioning the flexible support layer directly on the support plate includes holding the discrete component assembly on the support plate by application of a suction.

Positioning the flexible support layer directly on the support plate includes stretching the dynamic release tape over the support plate.

The method includes irradiating the dynamic release structure of the discrete assembly through the support plate to release the discrete component from the dynamic release tape.

In an aspect, a method includes dicing a wafer adhered to a dicing tape to form discrete components; transferring the discrete components from the dicing tape to a dynamic release tape to form a discrete component assembly, including: a flexible support layer, and a dynamic release structure disposed on the flexible support layer; and positioning the discrete component assembly in a component transfer system such that at least a portion of the dynamic release tape is freestanding.

Embodiments can include one or more of the following features.

The method includes irradiating the freestanding dynamic release tape to release the discrete component from the dynamic release tape.

The dynamic release structure of the dynamic release tape includes multiple layers. The dynamic release structure includes an active layer structure and a component adhesion layer, in which adhering the wafer to the dynamic release tape includes adhering the wafer to the component adhesion layer.

In an aspect, a method includes adhering a wafer to a dynamic release tape including: a freestanding flexible support layer, and a dynamic release structure disposed on the flexible support layer; and dicing the adhered wafer to form discrete components adhered to the dynamic release tape.

Embodiments can include one or more of the following features.

Adhering the wafer to the dynamic release tape includes adhering the wafer to a component adhesion layer of the dynamic release structure.

The dynamic release structure of the dynamic release tape includes multiple layers. The dynamic release structure includes an active layer structure and a component adhesion layer, in which adhering the wafer to the dynamic release tape includes adhering the wafer to the component adhesion layer.

In an aspect, a method includes adhering a wafer to a dynamic release tape including: a flexible support layer, and a dynamic release structure disposed on the flexible support layer; dicing the adhered wafer to form discrete components adhered to the dynamic release tape, in which the discrete components adhered to the dynamic release tape include a discrete component assembly; and positioning the flexible support layer of the discrete component assembly directly on a support plate of a component transfer system.

Embodiments can include one or more of the following features.

Positioning the flexible support layer directly on the support plate includes attaching the flexible support layer of the dynamic release tape directly to the support plate.

Positioning the flexible support layer directly on the support plate includes holding the discrete component assembly on the support plate by application of a suction.

Positioning the flexible support layer on the support plate includes stretching the dynamic release tape over the support plate.

The method includes irradiating the dynamic release structure of the discrete assembly through the support plate to release the discrete component from the dynamic release tape.

The dynamic release structure of the dynamic release tape includes multiple layers. The dynamic release structure includes an active layer structure and a component adhesion layer, in which adhering the wafer to the dynamic release tape includes adhering the wafer to the component adhesion layer.

In an aspect, a method includes adhering a wafer to a dynamic release tape including: a flexible support layer, and a dynamic release structure disposed on the flexible support layer; dicing the adhered wafer to form discrete components adhered to the dynamic release tape, in which the discrete components adhered to the dynamic release tape include a discrete component assembly; and positioning the discrete component assembly in a component transfer system such that at least a portion of the dynamic release tape is freestanding.

Embodiments can include one or more of the following features.

The method includes irradiating the freestanding dynamic release tape to release the discrete component from the dynamic release tape.

The dynamic release structure of the dynamic release tape includes multiple layers. The dynamic release structure includes an active layer structure and a component adhesion layer, in which adhering the wafer to the dynamic release tape includes adhering the wafer to the component adhesion layer.

In an aspect, an apparatus includes a dynamic release tape including: a flexible support layer; and a dynamic release structure disposed on the flexible support layer.

Embodiments can include one or more of the following features.

The dynamic release tape is sufficiently rigid to enable laser transfer of a discrete component from the dynamic release tape.

The dynamic release tape is sufficiently rigid to maintain a substantially planar configuration during laser transfer of a discrete component from the dynamic release tape. The flexible support layer includes a polymer. The dynamic release structure includes multiple layers. The dynamic release structure includes an absorbing and adhesion layer disposed on the flexible support layer and configured to adhere to the flexible support layer and to generate a gas responsive to irradiation by light; and an active layer disposed on the absorbing and adhesion layer. The active layer includes a blistering layer configured to respond mechanically to the generation of gas by the absorbing and adhesion layer. The dynamic release structure includes: an adhesion layer disposed on the flexible support layer and configured to adhere to the flexible support layer; and an active layer structure disposed on the adhesion layer. The active layer structure includes an absorbing and blistering layer configured to generate a gas responsive to irradiation by light, and to respond mechanically to the gas generation. The active layer structure includes: an absorbing layer disposed on the adhesion layer and configured to generate a gas responsive to irradiation by light; and a blistering layer configured to respond mechanically to the generation of gas by the absorbing layer. One of the layers of the dynamic release structure includes a component adhesion layer. An adhesion of the component adhesion layer is responsive to application of a stimulus.

The tape is stretchable.

The flexible support layer is transparent to ultraviolet light.

The apparatus includes a discrete component adhered to the dynamic release structure. The discrete component includes a light emitting diode (LED).

In an aspect, a method includes forming a dynamic release structure on a flexible support layer to form a dynamic release tape.

Embodiments can include one or more of the following features.

Forming the dynamic release structure includes forming multiple layers on the flexible support layer. Forming the dynamic release structure includes: forming an absorbing and adhesion layer on the flexible support layer, the absorbing and adhesion layer being configured to adhere to the flexible support layer and to generate a gas responsive to irradiation by light; and forming an active layer on the absorbing and adhesion layer. The active layer includes a blistering layer configured to respond mechanically to the generation of gas by the absorbing and adhesion layer. Forming the dynamic release structure includes: forming an adhesion layer on the flexible support layer, the adhesion layer being configured to adhere to the flexible support layer; and forming an active layer structure on the adhesion layer. The active layer structure includes an absorbing and blistering layer configured to generate a gas responsive to irradiation by light, and to respond mechanically to the gas generation. Forming the active layer structure includes: forming an absorbing layer on the adhesion layer, the absorbing layer being configured to generate a gas responsive to irradiation by light; and forming a blistering layer on the absorbing layer, the blistering layer being configured to respond mechanically to the generation of gas by the absorbing layer.

In an aspect, a dynamic release apparatus includes a flexible support layer; and a dynamic release structure disposed on the flexible support layer, the dynamic release structure including: an adhesion layer disposed on the flexible support layer and configured to adhere to the flexible support layer; and an active layer structure disposed on the adhesion layer.

Embodiments can include one or more of the following features.

The active layer structure includes an absorbing and blistering layer configured to generate a gas responsive to irradiation by light, and to respond mechanically to the gas generation.

The active layer structure includes: an absorbing layer disposed on the adhesion layer and configured to generate a gas responsive to irradiation by light; and a blistering layer configured to respond mechanically to the generation of gas by the absorbing layer.

The dynamic release structure includes a component adhesion layer.

In an aspect, a method includes positioning a discrete component assembly on a support fixture of a component transfer system, the discrete component assembly including a dynamic release tape including a flexible support layer, and a dynamic release structure disposed on the flexible support layer, and a discrete component adhered to the dynamic release tape. The method includes irradiating the dynamic release structure to release the discrete component from the dynamic release tape.

In an aspect, a discrete component transfer system includes a light source; and a discrete component support fixture including a support frame; a support plate positioned on the support frame, the support plate being transparent to light emitted by the light source; and an optical element disposed between the light source and the support frame.

In an aspect, a discrete component transfer system includes a light source; a discrete component support fixture; and a discrete component assembly disposed on the discrete component support fixture. The discrete component assembly includes a dynamic release tape comprising a flexible support layer and a dynamic release structure disposed on the flexible support layer, and a discrete component adhered to the dynamic release tape. The discrete component transfer system includes an optical element disposed between the light source and the discrete component assembly.

In an aspect, a method includes dicing a wafer adhered to a dicing tape to form discrete components; and transferring the discrete components from the dicing tape to a dynamic release tape to form a discrete component assembly, including a flexible support layer, and a dynamic release structure disposed on the flexible support layer.

In an aspect, a method includes adhering a wafer to a dynamic release tape including a flexible support layer, and a dynamic release structure disposed on the flexible support layer; and dicing the adhered wafer to form discrete components adhered to the dynamic release tape.

In an aspect, an apparatus includes a dynamic release tape including a flexible support layer; and a dynamic release structure disposed on the flexible support layer.

In an aspect, a method includes forming a dynamic release structure on a flexible support layer to form a dynamic release tape.

In an aspect, a dynamic release apparatus includes a support layer; and a dynamic release structure disposed on the support layer, the dynamic release structure including an adhesion layer disposed on the support layer and configured to adhere to the support layer; and an active layer structure disposed on the adhesion layer.

BRIEF DESCRIPTION OF DRAWINGS

FIGS. 2A and 2B are diagrams of a dynamic release tape with a support fixture.

DETAILED DESCRIPTION

We describe here an approach to laser-assisted transfer of discrete components from a thin, flexible dynamic release tape positioned on a support plate of a component transfer system. The dynamic release tape includes a multilayer dynamic release structure disposed on a support layer, such as a backing. Each layer of the dynamic release structure can be designed specifically to target one or more functionalities of the dynamic release structure, such as adhesion, optical properties, or mechanical properties. We also describe laser-assisted transfer of discrete components from a dynamic release tape that is disposed on a carrier substrate.

Figure 1A:
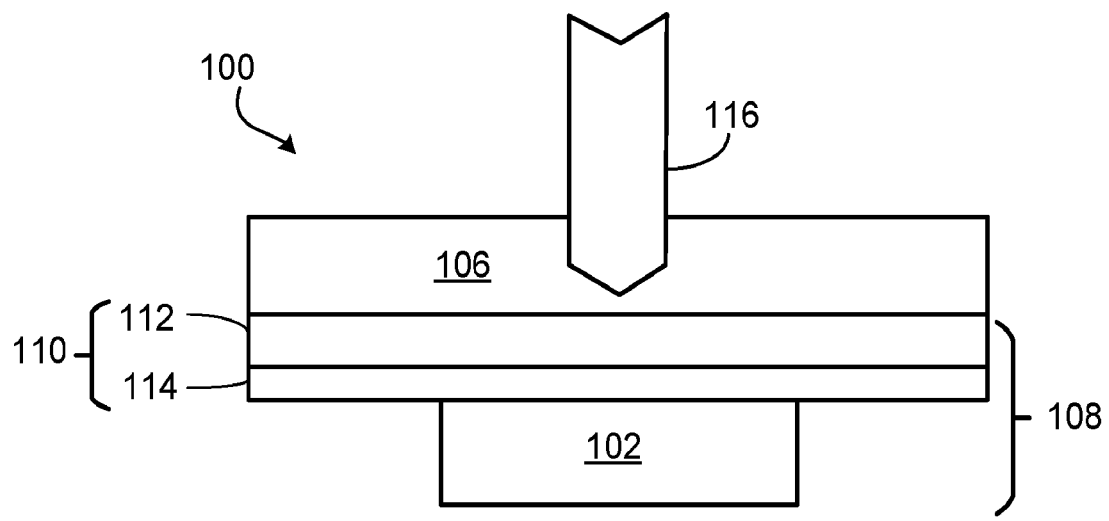
FIGS. 1A and 1B are diagrams of a laser-assisted transfer process.
Figure 1B:
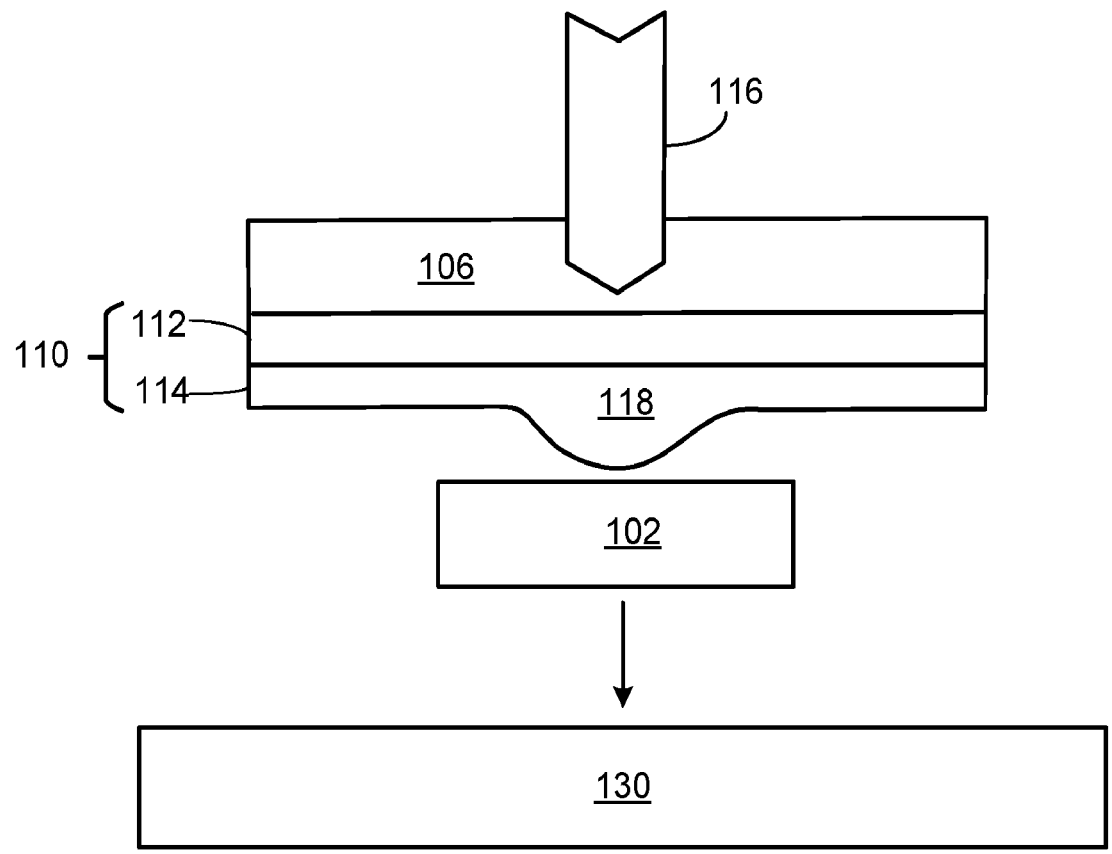

FIGS. 1A and 1B depict a laser-assisted transfer process for high-throughput, low-cost contactless assembly of discrete components 102 onto rigid or flexible substrates. The term discrete component refers generally to, for example, any unit that is to become part of a product or electronic device, for example, electronic, electromechanical, photovoltaic, photonic, or optoelectronic components, modules, or systems, for example any semiconductor material having a circuit formed on a portion of the semiconducting material. In some examples, the discrete components can be light emitting diodes (LEDs). The discrete components can be ultra-thin, meaning having a maximum thickness of 50 μm or less, 40 μm or less, 30 μm or less, 25 μm or less, 20 μm or less, 10 μm or less, or 5 μm or less. The discrete components can be ultra-small, meaning having a maximum length or width dimension less than or equal to 300 μm per side, 100 μm per side, 50 μm per side, 20 μm per side, or 5 μm per side. The discrete components can be both ultra-thin and ultra-small.

FIGS. 1A and 1B show a portion of a support fixture 100 of a component transfer system for laser-assisted transfer of discrete components 102. The support fixture 100 holds a flexible discrete component assembly 108 in position for the laser-assisted transfer process. The support fixture (described in more detail below) can include a rigid support plate 106 mounted on a frame (not shown: described in more detail below). The frame provides stability to the rigid support plate 106. In some examples, the frame can be manipulated, e.g., for alignment purposes. The discrete component assembly 108 can be attached to the support plate 106 by suction force, tensile stress, or in another way, as described in more detail below. The positioning of the discrete component assembly 108 on the support plate 106 is non-permanent, e.g., such that the discrete component assembly 108 can be removed from the support plate 106 after the laser-assisted transfer process is completed without damaging the support plate 106. The non-permanent attachment of the discrete component assembly 108 on the support plate 106 makes the support plate 106 available for multiple transfer processes involving multiple discrete component assemblies 108.

The discrete component assembly 108 includes a dynamic release tape 110 mounted on a wafer ring (not shown), with a discrete component 102 adhered to the dynamic release tape 110. Although we show only a single discrete component 102 here, multiple discrete components 102 can also be adhered to the dynamic release tape 110 and transferred by the component transfer system. A dynamic release tape (e.g., the tape 110) is a tape that includes a flexible support layer 112 and a dynamic release structure 114 disposed on the flexible support layer 112. A tape is a thin, flexible material composed of one or more layers. The flexible support layer 112 contacts the support plate 106 of the support fixture 100, and the discrete component 102 is adhered to the dynamic release structure 114. The dynamic release structure 114 can be a multi-layer structure, such as a structure having two, three, four, or more than four layers, as discussed in greater detail below.

Referring also to FIG. 1B, in the laser-assisted transfer process, a back side of the support plate 106 is irradiated with radiation 116, such as light, e.g., a laser beam. The support plate 106 and the flexible support layer 112 of the dynamic release tape 110 are both transparent to the wavelength of the radiation 116 (e.g., the laser energy). An element that is transparent to a given wavelength is an element for which at least some radiation of the given wavelength passes through the element. The radiation 116 passes through the support plate 106 and the flexible support layer 112 of the dynamic release tape 110 and is incident on an area of the dynamic release structure 114, causing ablation of a partial thickness of the dynamic release structure 114 in the area on which the radiation 116 is incident (which we refer to as the irradiated area). The ablation generates confined gas, which expands, generating a stress in the dynamic release structure 114. The stress causes at least some of the material of the dynamic release structure 114 to deform, forming a blister 118. The blister 118 exerts a mechanical force on the discrete component 102. When the mechanical force exerted by the blister 118 is sufficient to overcome the adhesion between the discrete component 102 and the dynamic release structure 114, the mechanical force exerted by the blister 118 (in combination with gravity)

propels the discrete component away from the support plate 106 (e.g., in a downward direction) for transfer to a target substrate 130.

The target substrate 130 can be positioned in close proximity to the discrete component 102, e.g., at a distance of between about 5 µm and about 300 µm. The use of a rigid support plate 106 to support the tape-based discrete component assembly 108 helps to maintain a consistent separation between the discrete components 102 of the discrete component assembly 108 and the target substrate 130, e.g., by preventing sagging or other structural variations in the tape 110. In some examples, the support plate 106 can be provided with a high degree of surface flatness. For instance, the support plate 106 can be machined to high precision.

In some laser-assisted transfer processes, discrete components are adhered to a rigid, transparent carrier substrate by a dynamic release structure. The carrier substrate with adhered discrete components is provided to a component transfer system for laser-assisted transfer of the discrete components. The component transfer systems described here, in which a rigid, transparent support plate is incorporated into the component transfer system itself, enables discrete components to be transferred from a tape rather than from a rigid carrier substrate, reducing the cost (e.g., in materials, fabrication, transportation, etc.) of end-to-end discrete component transfer processes. For instance, rigid carrier substrates can be significantly more expensive than dynamic release tapes. Furthermore, dynamic release tapes are disposable, eliminating the need for and associated cost of refurbishing the rigid carrier substrates.

In some examples, the dynamic release tapes used in discrete component transfer processes are freestanding tapes. Freestanding tapes are tapes that are not attached to a rigid substrate. In some examples, freestanding tapes can be positioned on, but not attached to, a rigid substrate for one or more steps of a discrete component transfer process. For instance, a freestanding tape can be positioned on a rigid substrate during attachment of discrete components to the tape, during introduction into a component transfer system, or during laser-assisted transfer of discrete components.

In some examples, the dynamic release tapes used in discrete component transfer processes are not freestanding tapes, but instead are attached to a rigid substrate during attachment of discrete components to the tape, during introduction into a component transfer system, and during laser-assisted transfer of discrete components.

Further description of laser-assisted transfer processes can be found in U.S. Patent Publication No. US 2014/0238592, the contents of which are incorporated here by reference in their entirety.

FIGS. 2A and 2B show cutaway views of an example support fixture 200 including a support plate 206 for positioning a discrete component assembly 208 for a laser-assisted transfer process. The support plate 206 is a rigid plate that is transparent to the wavelength of the radiation used for the laser transfer process, e.g., ultraviolet (UV) light. For instance, the support plate 206 can be a glass plate, a quartz plate, or a plate of another material. The support plate 206 is mounted on a frame 220 of the support fixture. In some examples, such as is shown in FIGS. 2A and 2B, the frame 220 has an opening 221 to allow radiation to reach the support plate 206. In some examples, the frame 220 can lack the opening and can be transparent to the wavelength of the radiation such that the radiation is transmitted through the frame 220.

The discrete component assembly 208 includes a freestanding dynamic release tape 210 mounted on a wafer ring 222, with discrete components 102 adhered to the dynamic release tape 210. For instance, the dynamic release tape 210 can be stretched on the wafer ring 222. In the example of FIGS. 2A-2B, the dynamic release tape 210 includes a flexible support layer 212 with a multilayer dynamic release structure 214 disposed on the flexible support layer 212. The example multilayer dynamic release structure 214 includes multiple sublayers 224a, 224b that have adhesion, radiation absorption, and blistering functionality; and a component adhesive layer 226 that adheres to the discrete component 102. Multilayer dynamic release structures 214 are discussed in greater detail below.

Referring specifically to FIG. 2B, to position the discrete component assembly 208 on the support plate 206 of the component transfer system, the wafer ring 222 is brought into contact with the frame 220 and the back side of the flexible support layer 212 of the dynamic release tape 210 is brought into contact with the support plate 206. When positioned, a top surface 223 of the wafer ring 222 is substantially level with (e.g., aligned with) a top surface 207 of the support plate 206, such that the dynamic release tape 210 is substantially flat across its entire lateral extent.

A suction is applied through an air flow channel 228, e.g., by a suction source of the component transfer system to hold the dynamic release tape 210 against the support plate 206. For instance, the air flow channel 228 can be defined through a thickness of the frame 220 of the component transfer system (as shown) or through a thickness of the support plate 206, or both. Application of a suction pulls the dynamic release tape 210 firmly against the support plate 206, e.g., such that the dynamic release structure 214 is substantially flat.

Figure 10:
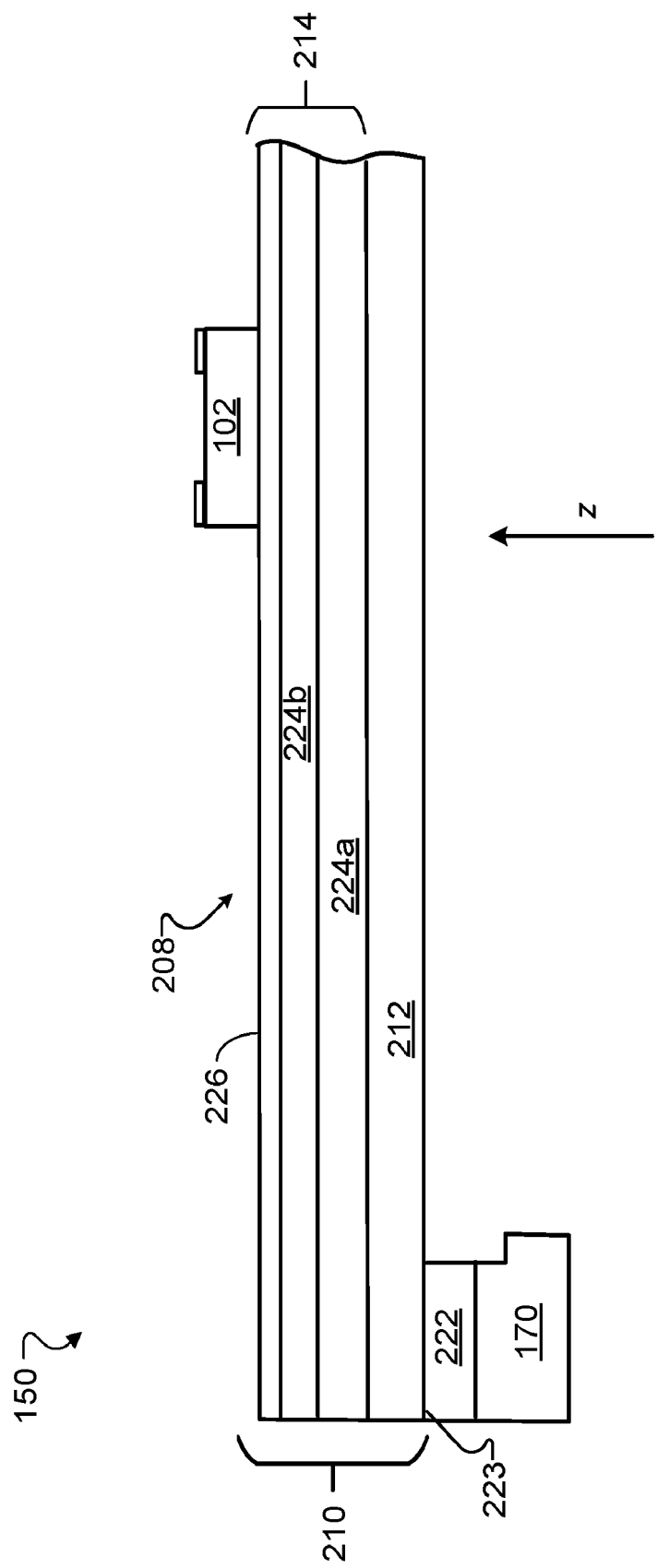
FIG. 10 is a diagram of a dynamic release tape with a support fixture.

Referring to FIG. 10, in some examples, a support fixture 150 includes a frame 170 but no support plate (e.g., no support plate 206 as shown in FIGS. 2A and 2B). The wafer ring 222 of the discrete component assembly 208 is mounted on the frame 170 of the support fixture 150, and the dynamic release tape 210 remains otherwise freestanding for the laser-assisted transfer process. Laser-assisted transfer directly from the freestanding dynamic release tape 210 can be carried out when the dynamic release tape 210 is sufficiently rigid, such as rigid enough to maintain a substantially planar configuration throughout the duration of the laser-assisted transfer process. For instance, the dynamic release tape 210 can be sufficiently rigid such that when the discrete component assembly 208 is mounted on the frame 170, the maximum deviation of the dynamic release tape 210 in a direction z perpendicular to the plane of the tape 210 is less than a threshold amount, e.g., less than 20 µm, less than 10 µm, or less than 5 µm.

Figure 3:
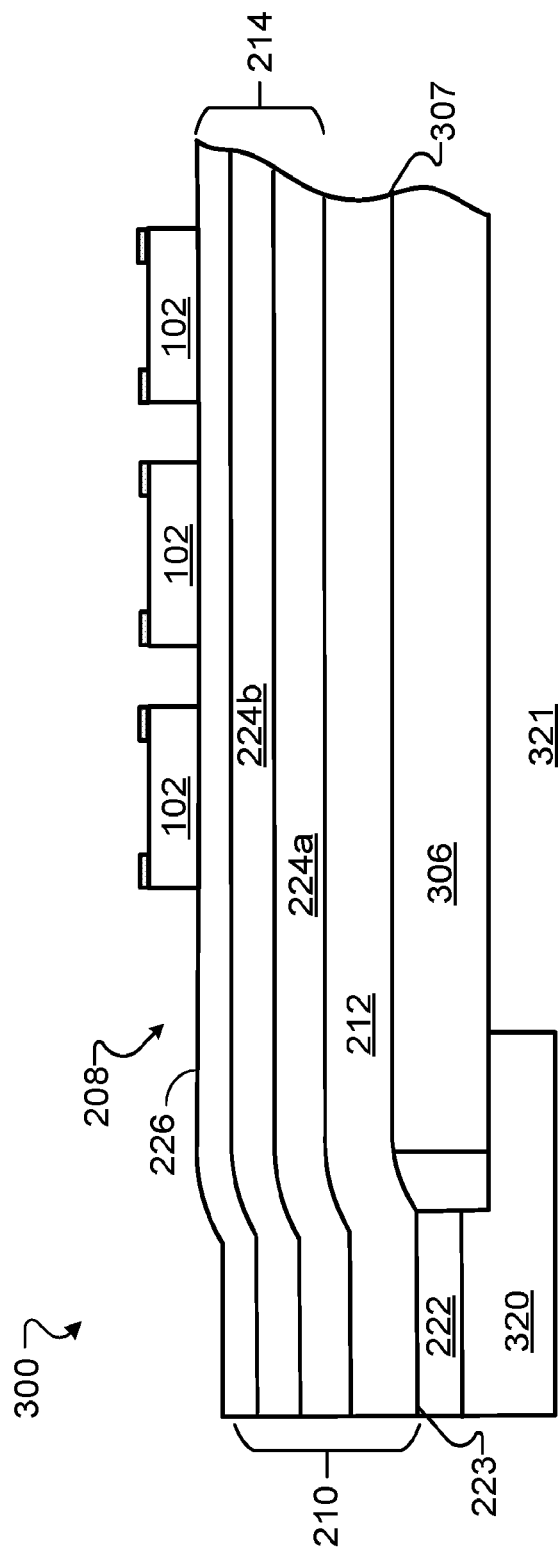
FIG. 3 is a diagram of a dynamic release tape with a support fixture.

FIG. 3 shows a cutaway view of an example support fixture 300 including a support plate 306 for positioning the discrete component assembly 208 for a laser-assisted transfer process. The support plate 306 is a rigid plate that is transparent to the wavelength of the radiation used for the laser transfer process, e.g., UV light. The support plate 306 is mounted on a frame 320 of the support fixture 300. The frame 320 has an opening 321 to allow radiation to reach the support plate 306. In some examples, the frame 320 can be transparent to the wavelength of the radiation such that the radiation is transmitted through the frame 320.

In the example of FIG. 3, when the discrete component assembly 208 is positioned on the support fixture 300, the top surface 223 of the wafer ring 222 is at a lower level than (e.g., misaligned from) a top surface 307 of the support plate 306. For instance, the frame 320 of the support fixture 300 can be misaligned from the top surface of the support plate 306 by an amount such that when the discrete component assembly 208 is positioned on the support plate, there is still a misalignment between the support plate 306 and the wafer ring 222. This misalignment introduces a tensile stress in the dynamic release tape 210 that holds the dynamic release tape 210 against the support plate 306, e.g., such that the dynamic release structure 214 is substantially flat. The amount of tensile stress, and hence the force with which the dynamic release tape 210 is held against the support plate 306, can be controlled by varying the height difference between the top surface 223 of the wafer ring 222 and the top surface 307 of the support plate 306.

In some examples, other approaches can be employed to position the dynamic release tape 210 on a support plate of a component transfer system, such as by using approaches involving magnetic forces, static electricity, mechanical fixation, or other approaches.

Figure 4:
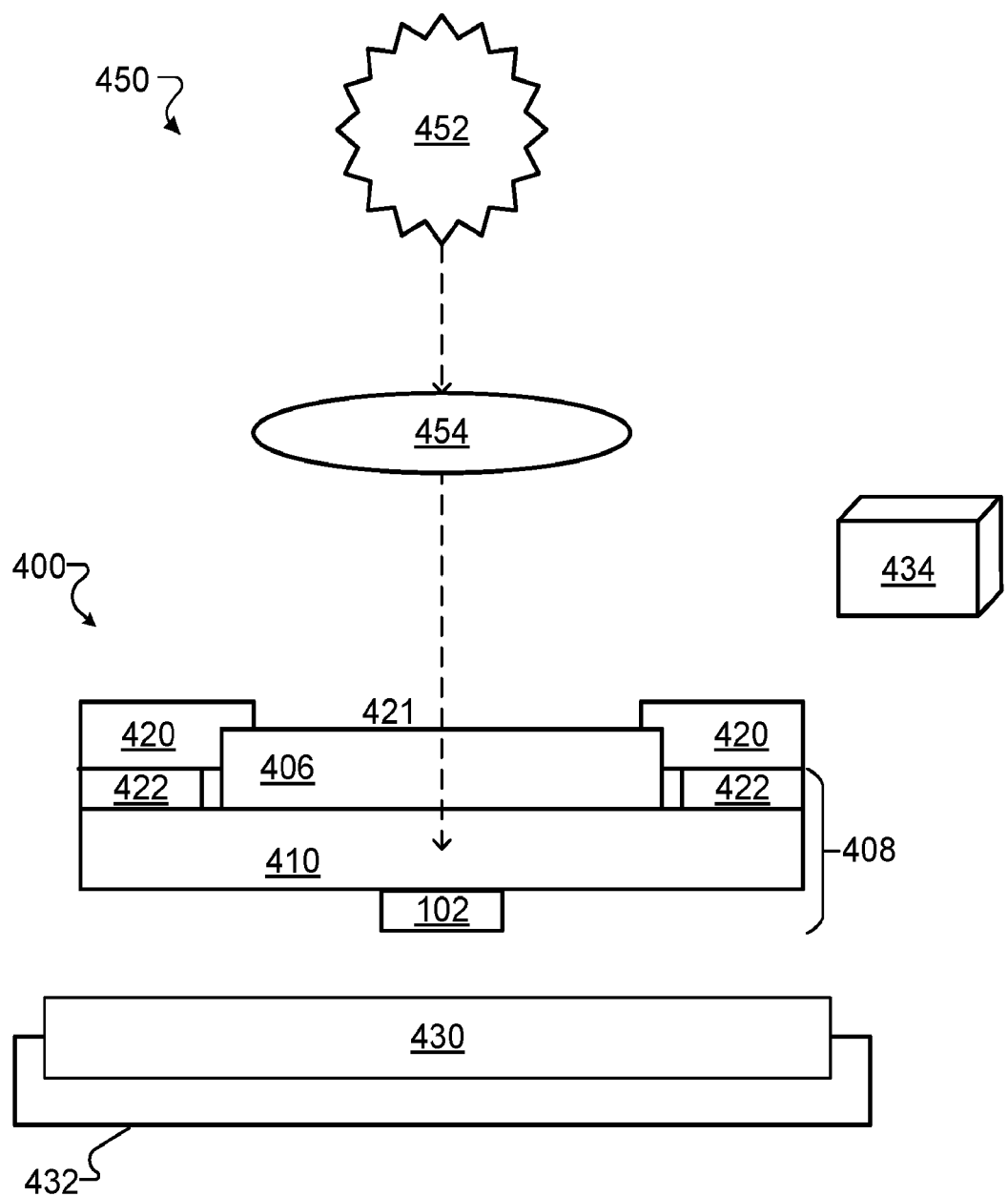
FIGS. 4 and 5 are diagrams of systems for laser-assisted transfer of discrete components.

FIG. 4 shows an example of a component transfer system 450. The component transfer system 450 includes a support fixture 400 having a support plate 406 mounted on a frame 420. The support fixture 400 is positioned such that a discrete component assembly 408 is held on the support plate 406. The discrete component assembly 408 includes a dynamic release tape 410 with an attached discrete component 102, with the dynamic release tape 410 mounted on a wafer ring 422, e.g., stretched on the wafer ring 422. For instance, the wafer ring 422 is positioned on the frame 420 and the stretched dynamic release tape 410 is held against the support plate 406. The discrete component assembly 408 can be irradiated with radiation (e.g., light, such as UV light) from a light source 452, e.g., a laser. Light from the light source 452 can be manipulated, e.g., focused, by an optical element 454, such as a lens, disposed between the light source 452 and the support plate 406. The frame 420 has an opening 421 to allow radiation from the light source 452 to reach the support plate 406. A substrate holder 432 holds a target substrate 430 onto which the discrete components are transferred by the laser-assisted transfer process.

In some examples, such as when the support fixture 400 is configured to hold a discrete component assembly against the support plate 406 by application of a suction, the component transfer system 450 can include a suction source 434 that is fluidically connected (e.g., by tubing, not shown) to one or more air flow channels (not shown) in the support plate 406 or the frame 420.

Figure 5:
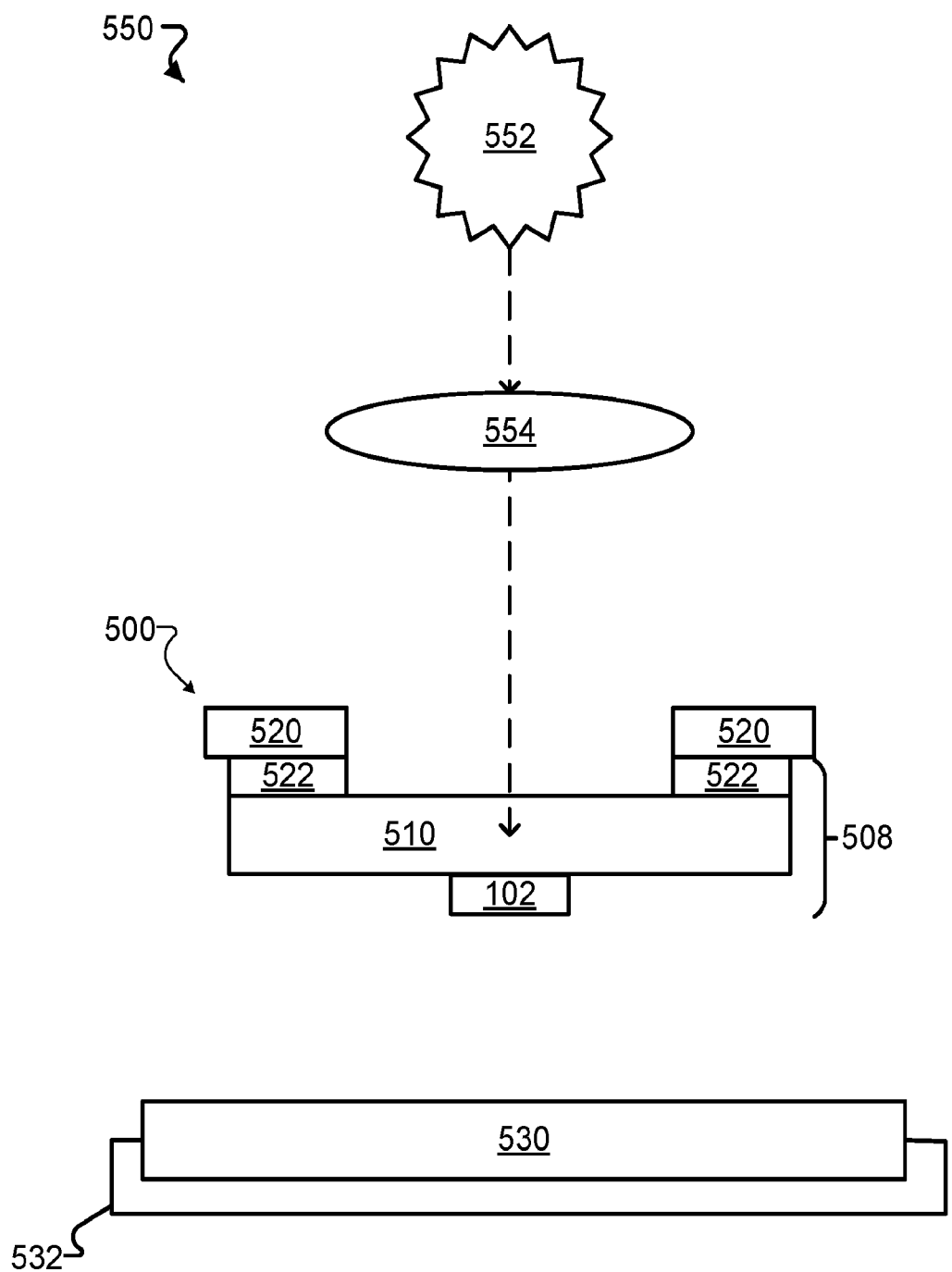

FIG. 5 shows an example of a component transfer system 550 having a light source 552 and an optical element 554. The component transfer system 550 includes a support fixture 500 including a frame 520. No support plate is mounted on the frame 520. A discrete component assembly 508 is held on the frame 520, the discrete component assembly 508 including a dynamic release tape 510 mounted on a wafer ring 522. In this configuration, the wafer ring 522 of the discrete component assembly 508 is positioned on the frame 520 and the dynamic release tape 510 is a freestanding tape (meaning a tape that is not supported by a rigid substrate or support plate) during the laser-assisted transfer process. The discrete components 102 are transferred onto a target substrate 530 held by a substrate holder 532.

In some examples, the component transfer systems 450, 550 can be configured for parallel transfer of multiple discrete components, or can be configured to have a single-component transfer mode and a multiple-component transfer mode, as described in more detail in WO 2018/231344, filed on Apr. 25, 2018, the contents of which are incorporated here by reference in their entirety.

Figure 6:
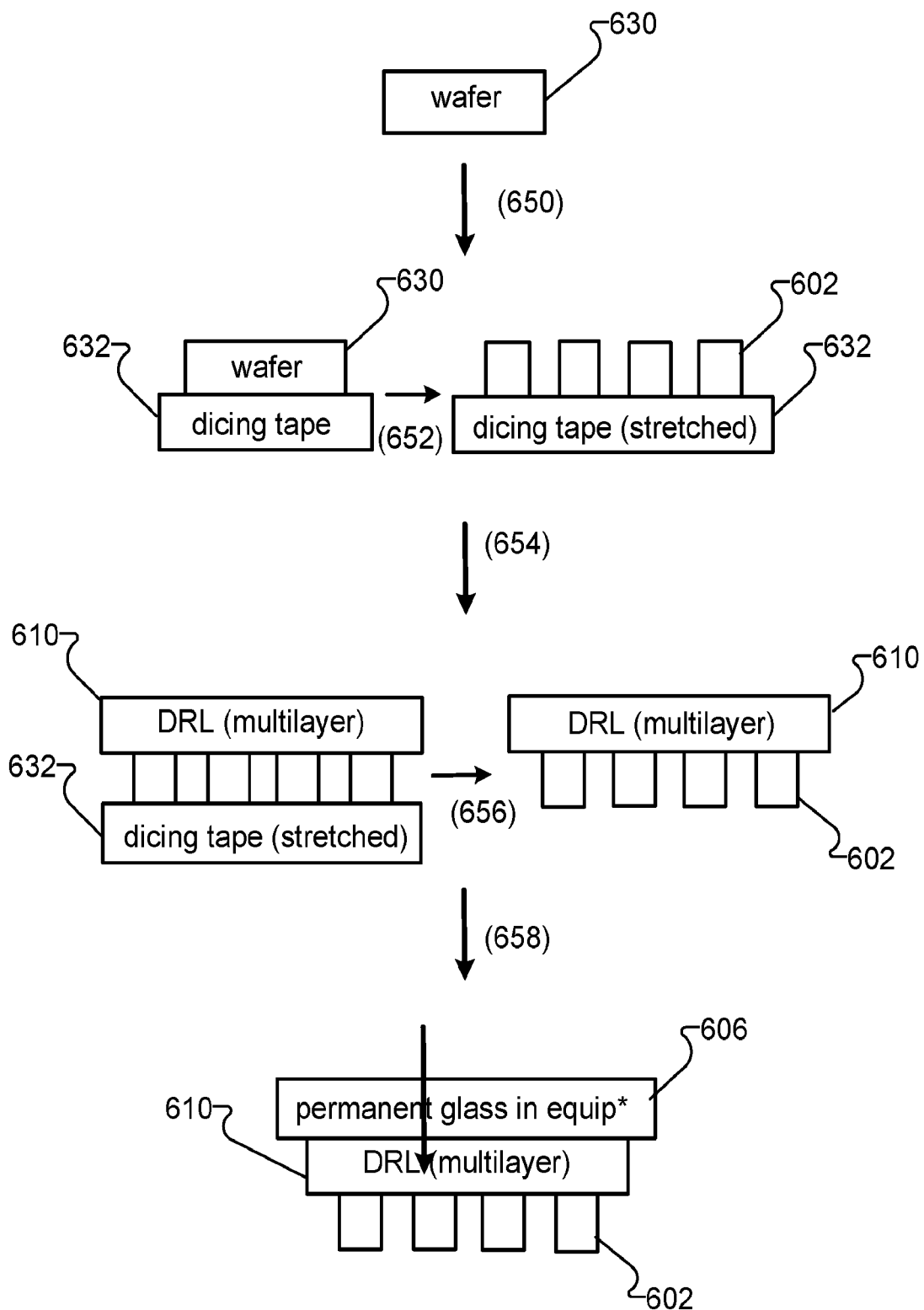
FIGS. 6 and 7 are process diagrams.

Referring to FIG. 6, in some examples, discrete components 602 can be transferred to a dynamic release tape 610 after a dicing process. A wafer 630 including one or more electronic components (e.g., integrated circuits) is adhered (650) to a dicing tape 632 and diced (652) to form discrete components 602, e.g., using standard wafer processing techniques for wafer dicing. For instance, the dicing tape 632 can be mounted on a wafer ring. In some examples, the dicing process can include stretching the dicing tape laterally to separate the discrete components 602, e.g., by expanding the dicing tape 632 onto the wafer ring.

The discrete components 602 are transferred (654) onto a dynamic release tape 610 and the dicing tape 632 is removed (656), leaving the discrete components 602 adhered to the dynamic release tape 610. For instance, the discrete components 602 can be adhered to a component adhesion layer of the dynamic release tape 610 (discussed below). The dynamic release tape 610 with the adhered discrete components 602 is attached (658) to a transparent, rigid support plate 606 of a component transfer system for laser-assisted transfer of the discrete components 602 onto a target substrate. For instance, a flexible support layer of the dynamic release tape 610 is attached to the support plate, e.g., by suction, tensile stress, or in another way.

Figure 7:
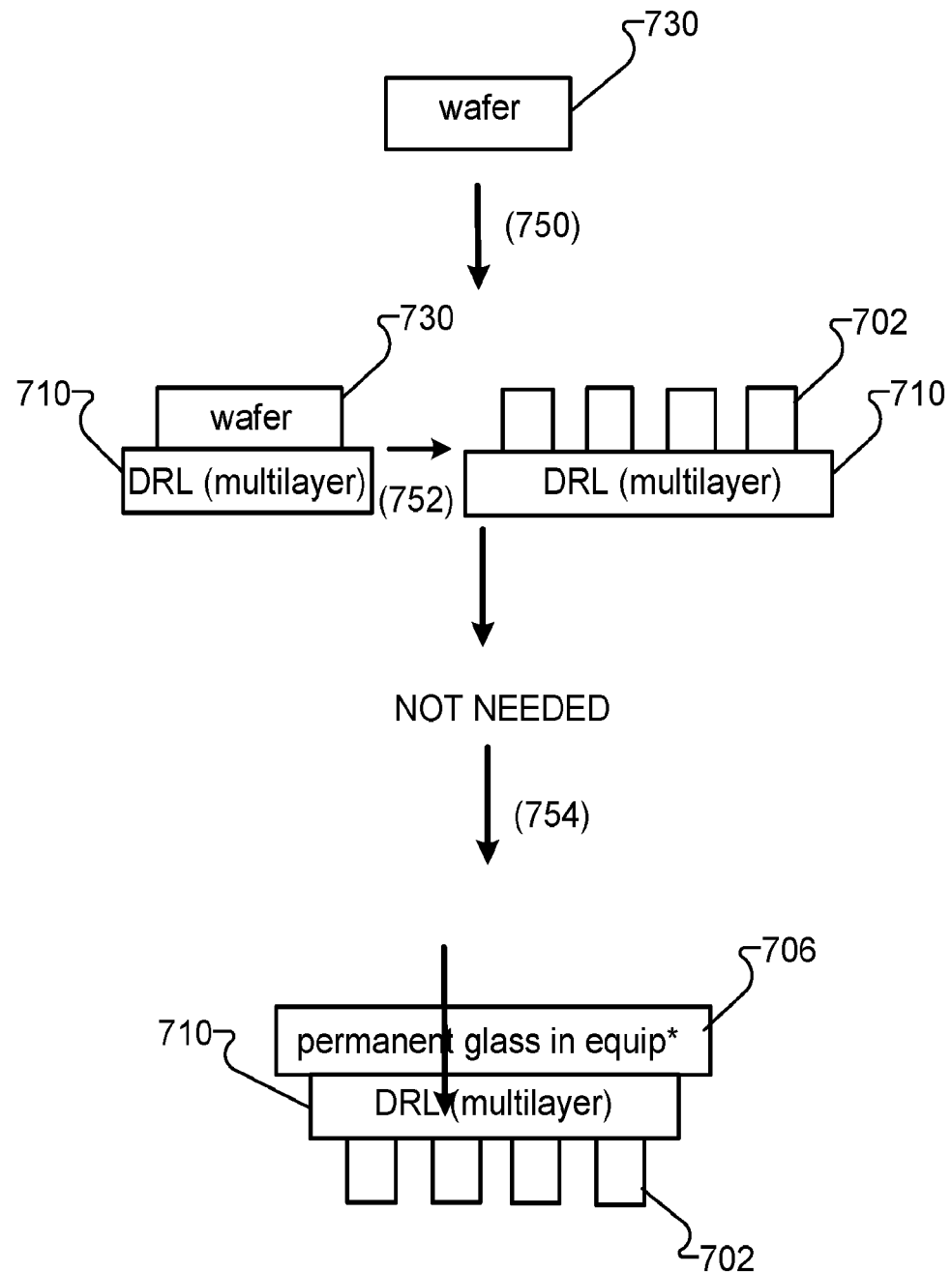

Referring to FIG. 7, in some examples, discrete components 702 can be diced directly on a dynamic release tape 710. A wafer 730 including one or more semiconductor dies (e.g., integrated circuits) is adhered (750) to the dynamic release tape 710, e.g., to a component adhesion layer of the dynamic release tape 710. The adhered wafer 730 is diced (752) to form discrete components 702, e.g., using standard wafer processing techniques for wafer dicing. For instance, the dynamic release tape 710 can be mounted on a wafer ring. In some examples, the dynamic release layer tape 710 is stretchable and the dicing process can include stretching the dynamic release layer tape 710 laterally to separate the discrete components 702, e.g., by expanding the dynamic release tape on the wafer ring.

The dynamic release layer tape 710 with the adhered discrete components 702 is attached (754) to a transparent, rigid support plate 706 of a component transfer system for laser-assisted transfer of the discrete components 702 onto a target substrate. For instance, a flexible support layer of the dynamic release tape 710 is attached to the support plate, e.g., by suction, tensile stress, or in another way.

In the process of FIG. 7, the step of transferring the diced discrete components 702 from a dicing tape to the dynamic release layer tape is not included, making the process of FIG. 7 streamlined and efficient.

Figure 8A:
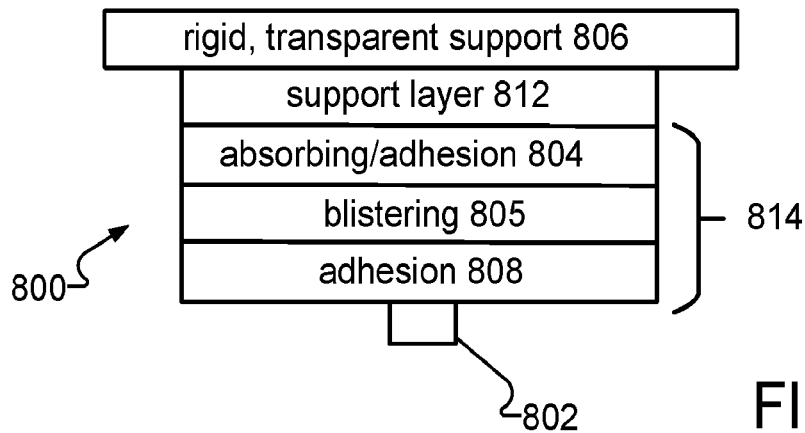
FIGS. 8A-8C are diagrams of multilayer dynamic release tapes mounted on support plates.
Figure 8B:
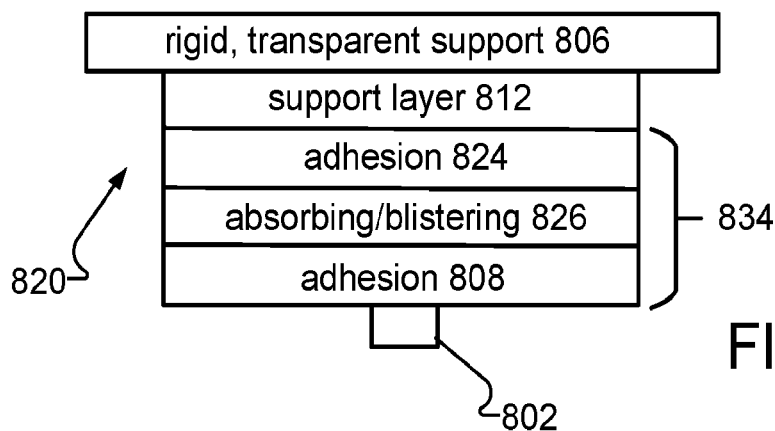
Figure 8C:
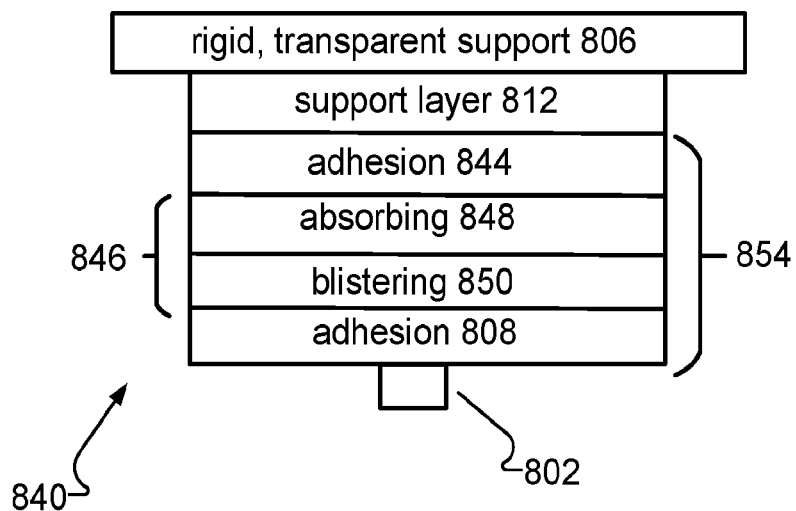

Referring to FIGS. 8A-8C, dynamic release layer tapes 800, 820, 840 can be multi-layer tapes having a flexible support layer 812 and a multilayer dynamic release structure 814, 834, 854, respectively, disposed on the flexible support layer 812. Discrete components 802 can be adhered to the dynamic release structures 814, 834, 854 by a component adhesion layer 808 that forms part of each multilayer dynamic release structure 814, 834, 854. The multilayer dynamic release structures 814, 834, 854 can be formed of varying numbers of layers having various compositions and functions. As shown in FIGS. 8A-8C, the dynamic release layer tapes 800, 820, 840 can be positioned on a rigid support, such as a support plate 806 of a component transfer system, that is transparent to the radiation used for laser-assisted transfer processes. In some examples, the dynamic release layer tapes 800, 820, 840 can be used in other environments, such as attached to a wafer ring, or otherwise used.

The flexible support layer 812 is a thin, flexible film that is transparent to the radiation used for the laser-assisted transfer processes, e.g., transparent to UV light. For instance, the flexible support layer 812 can be a polymer film, such as polyvinylchloride (PVC), polyethylene terephthalate (PET) or poly(methyl methacrylate) (PMMA). The flexible support layer 812 is sufficiently thin and flexible such that the dynamic release layer tape 800, 820, 840 can be manipulated, e.g., rolled, bent, or stretched, without breaking the tape. The presence of the flexible support layer 812 allows the dynamic release layer tapes 800, 820, 840 to be freestanding tapes, e.g., with sufficient mechanical integrity to be handled without being attached to a rigid substrate.

Referring specifically to FIG. 8A, in some examples, the dynamic release structure 814 of the dynamic release layer tape 800 can be a three-layer structure having an absorbing and adhesion layer 804 disposed on the flexible support layer 812 and an active layer 805, such as a blistering layer (as shown in FIG. 8A), disposed on the absorbing and adhesion layer 804. The component adhesion layer 808 is disposed on the active layer 805.

The absorbing and adhesion layer 804 has a dual functionality: bonding of the active layer 805 to the flexible support layer 812, and absorption of energy from the irradiation during a laser-assisted transfer process. For instance, the absorbing and adhesion layer 804 can absorb at least 90%, at least 95%, at least 98%, or at least 99% of the energy that is incident on the absorbing and adhesion layer 804, e.g., to prevent the radiation from reaching and potentially damaging the discrete components adhered to the tape 800.

Energy absorption by the absorption and adhesion layer 804 results in ablation of the layer, generating a gas. The generated gas induces a mechanical response in the adjacent active layer 805. For instance, as shown in FIG. 8A, the active layer 805 can be a blistering layer in which a blister is formed (e.g., as shown in FIG. 1B) responsive to the gas generation.

Referring to FIG. 8B, in some examples, the dynamic release structure 834 of the dynamic release layer tape 820 can be a three-layer structure having an adhesion layer 824 disposed on the flexible support layer 812 and an active layer 826, such as an absorbing and blistering layer (as shown in FIG. 8B), disposed on the adhesion layer 824. The component adhesion layer 808 is disposed on the active layer 826.

The adhesion layer 824 exhibits an adhesion sufficient to bond the active layer 826 to the flexible support layer 812. In the example of FIG. 8B, the active layer 826 is an absorbing and blistering layer. The active layer 826 absorbs energy from the irradiation during a laser-assisted transfer process, generating a gas which induces a mechanical response, such as formation of a blister, in the active layer 826. For instance, the active layer 826 can absorb at least 90%, at least 95%, at least 98%, or at least 99% of the incident energy.

Referring to FIG. 8C, in some examples, the dynamic release structure 854 of the dynamic release layer tape 840 can be a four-layer structure having an adhesion layer 844 disposed on the flexible support layer 812 and an active layer structure 846 disposed on the adhesion layer 844. The component adhesion layer 808 is disposed on the active layer structure 846.

The adhesion layer 844 exhibits an adhesion sufficient to bond the active layer structure 846 to the flexible support layer 812. The active layer structure 846 includes two layers, an absorbing layer 848 and a blistering layer 850. The absorbing layer 848 absorbs energy from the irradiation during a laser-assisted transfer process, generating a gas. For instance, the absorbing layer 848 can absorb at least 90%, at least 95%, at least 98%, or at least 99% of the incident energy. The generation of gas induces a mechanical response, such as formation of a blister, in the blistering layer 850.

Dynamic release structures (e.g., the dynamic release structures 814, 834, 854) have multiple functionalities, e.g., adhesion to the flexible support layer, internal adhesion between layers, absorption of incident radiation, and mechanical response (e.g., blistering). The multilayer nature of the dynamic release structures 814, 834, 854 can allow for each layer to be designed specifically to achieve one or more of these functionalities.

In the example of FIG. 8A, the absorbing and adhesion layer 804 can be designed to adhere to the support layer 812, to absorb incident radiation, and to generate a sufficient amount of gas to cause formation of a blister in the active layer 805. In some examples, the absorbing and adhesion layer 804 can be designed to promote internal adhesion, e.g., to adhere to the active layer 805 with sufficient adhesion to at least partially avoid delamination of the blister, which could result in a large diameter blister with the potential to impact the transfer of discrete components in neighboring positions, e.g., discrete components not intended for transfer. In the design of the absorbing and adhesion layer 804, the optical and adhesion properties of the layer can be the focus of the design, while the mechanical properties of the layer, such as its strength or modulus, can be secondary to the design. In contrast, the thickness and composition of the active layer 805 can be designed with a focus on mechanical properties, e.g., to achieve a desired blistering response, while the optical and adhesion properties of the layer can be secondary. In some examples, the active layer 805 can be designed to have mechanical properties that allow for formation of blisters of a target size and that do not rupture, and to prevent any of the gas generated by the absorbing and adhesion layer 804 from escaping from the dynamic release structure 814. For instance, the target size for a blister can be a height-to-diameter ratio of about one and a base diameter no greater than about three times the diameter of the irradiation beam (e.g., a laser beam). In a specific example, the active layer 805 can be a polymer film, e.g., a film of PET or a polyimide, with a thickness of between about 2 µm and about 5 µm.

Furthermore, in the dynamic release structure 814 of FIG. 8A, the active layer 805 does not itself absorb energy, and so is not partially-ablated. Rather, the ablation occurs in the adjacent absorbing and adhesion layer 804. Because no ablation occurs in the active layer 805, the thickness of the active layer 805 is not affected by the amount of laser energy delivered to the blister location, meaning that the active layer 805 is not thinned by the irradiation. This separation of ablation and blister formation into two distinct layers allows for the use of higher pulse energies to create larger blisters.

In some examples, such as when the discrete components 802 are transferred from a dicing tape (as in FIG. 6) or other source substrate to a dynamic release layer tape, or when a wafer is diced directly on a dynamic release layer tape to form the discrete components 802, the component adhesion layer 808 can be designed to have an adhesive strength that is greater than the force that holds the discrete components 802 to their source substrate. In some examples, a relatively low adhesion between the component adhesion layer 808 and the discrete components 802 can contribute to a high precision during the laser-assisted transfer process. The component adhesion layer 808 can be designed to have an adhesive strength that is as low as possible while still being sufficient to keep the discrete components adhered to the dynamic release layer tape prior to the laser-assisted transfer process. In some examples, to satisfy these contradicting criteria of the component adhesion layer 808 having both a high adhesive strength and a low adhesive strength, the component adhesion layer 808 can be designed to have an adhesive strength that can be modified by application of a stimulus, such as UV light or heat. The initial strong adhesion of the component adhesion layer 808 can facilitate a reliable transfer of the discrete components 802 from their source substrate to the dynamic release layer tape. The initial adhesion of the component adhesion layer 808 can also support a wafer during a dicing process to form the discrete components. Before the laser-assisted transfer process, a stimulus can be applied, reducing the adhesion between the component adhesion layer 808 and the discrete components 802 to a level that can contribute to precise component placement during the transfer.

Figure 9A:
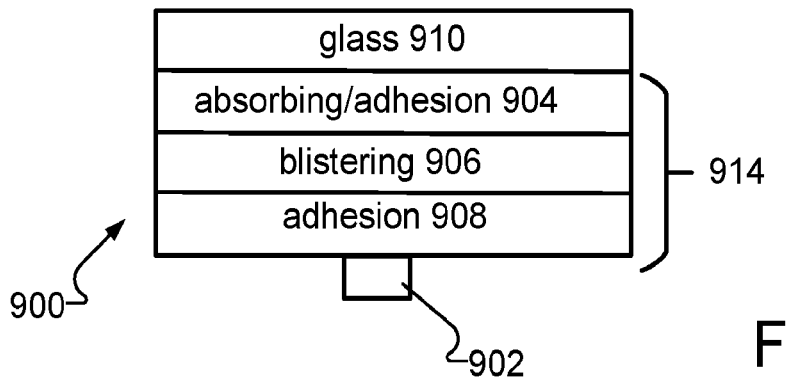
FIGS. 9A-9C are diagrams of multilayer dynamic release structures.
Figure 9B:
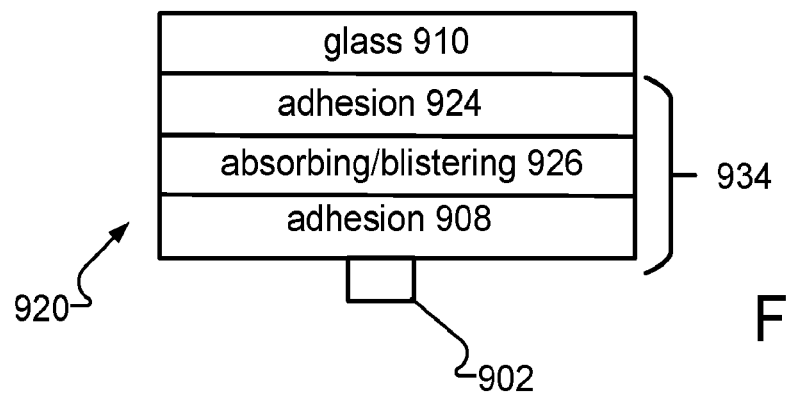
Figure 9C:
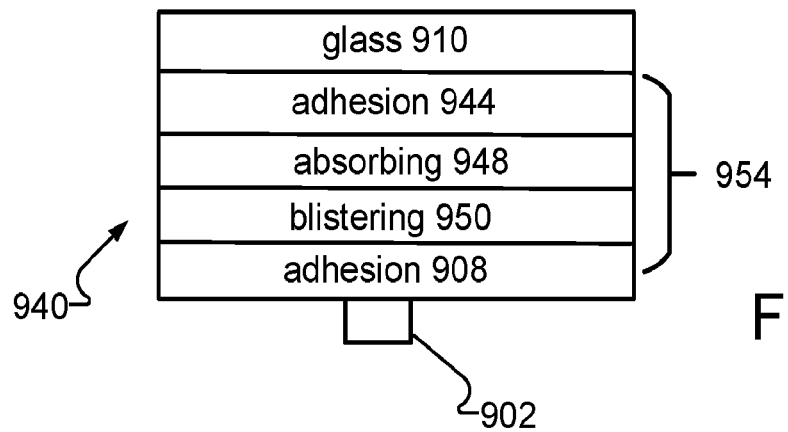

Referring to FIGS. 9A-9C, in some examples, a multi-layer dynamic release structure 914, 934, 954 can be applied to a rigid carrier substrate 910, such a glass carrier substrate. Discrete components 902 can be adhered to the rigid carrier substrate 910 by the dynamic release structures 914, 934, 954 to form discrete component assemblies 900, 920, 940. The discrete components 902 can be transferred onto a target substrate by a laser-assisted transfer process directly from the rigid carrier substrate 910.

The dynamic release structures can be provided as free-standing tapes and applied onto carrier substrate 910 as tapes, e.g., by roll coating or other ways of tape application. In some examples, dynamic release structures can be spin coated onto carrier substrates. The application of a dynamic release structure in tape form onto a carrier substrate can have advantages over spin coating, such as reduced cost, less labor intensive processing, and more efficient application.

The dynamic release structures 914, 934, 954 provided in tape form for application to a rigid carrier substrate 910 can be multilayer structures such as those described above with respect to FIGS. 8A-8C.

Referring specifically to FIG. 9A, in some examples, the dynamic release structure 914 can be a three-layer structure having an absorbing and adhesion layer 904 that adheres to the rigid carrier substrate 910. An active layer 906, such as a blistering layer (as shown in FIG. 9A), is disposed on the absorbing and adhesion layer 904. A component adhesion layer 908 is disposed on the active layer 906.

The absorbing and adhesion layer 904 has a dual functionality: bonding of the active layer 906 to the rigid carrier substrate 910, and absorption of energy from the irradiation during a laser-assisted transfer process. Energy absorption by the absorption and adhesion layer 904 results in ablation of the layer, generating a gas. The generated gas induces a mechanical response in the adjacent active layer 906. For instance, as shown in FIG. 9A, the active layer 906 can be a blistering layer in which a blister is formed responsive to the gas generation, effecting transfer of the discrete components 902.

Referring to FIG. 9B, in some examples, the dynamic release structure 934 can be a three-layer structure having an adhesion layer 924 that adheres to the rigid carrier substrate 910 and an active layer 926, such as an absorbing and blistering layer (as shown in FIG. 9B), disposed on the adhesion layer 924. The component adhesion layer 908 is disposed on the active layer 926. The adhesion layer 924 exhibits an adhesion sufficient to adhere to the carrier substrate 910. In the example of FIG. 9B, the active layer 926 is an absorbing and blistering layer that absorbs energy from the irradiation during a laser-assisted transfer process, generating a gas which induces a mechanical response, such as formation of a blister, in the active layer 926.

Referring to FIG. 9C, in some examples, the dynamic release structure 954 can be a four-layer structure having an adhesion layer 944 that adheres to the rigid carrier substrate 910 and an active layer structure 946 disposed on the adhesion layer 944. The component adhesion layer 908 is disposed on the active layer structure 946. The active layer structure 946 includes two layers, an absorbing layer 948 and a blistering layer 950. The absorbing layer 948 absorbs energy from the irradiation during a laser-assisted transfer process, generating a gas. The generation of gas induces a mechanical response, such as formation of a blister, in the blistering layer 950.

The individual layers of the multilayer dynamic release structures can be designed to achieve desired functionalities, as described above with respect to FIGS. 8A-8C. For instance, the adhesion layers 904, 924, 954 that adhere to the carrier substrate 910 can be designed to have an adhesion to the carrier substrate that is low enough to allow for easy removal, facilitating refurbishment of the carrier substrate after completion of the laser transfer process.

A number of embodiments have been described. Nevertheless, it will be understood that various modifications may be made without departing from the spirit and scope of the invention. For example, some of the steps described above may be order independent, and thus can be performed in an order different from that described.

Other implementations are also within the scope of the following claims.

What is claimed is:

1. A method comprising:
  positioning a discrete component assembly on a discrete component support fixture of a discrete component transfer system, the discrete component transfer system including
    a light source;
    the discrete component support fixture including (a) a support frame, and (b) a support plate positioned on the support frame, the support plate being transparent to light emitted by the light source; and
    an optical element disposed between the light source and the support frame,
    the discrete component assembly including (a) a dynamic release tape including a flexible support layer and a dynamic release structure disposed on the flexible support layer, and (b) a discrete component adhered to the dynamic release tape,
  wherein a top surface of the support plate is misaligned from a top surface of the support frame by an amount sufficient to introduce a tensile stress in the dynamic release tape held on the discrete component support fixture; and
  irradiating the dynamic release structure to release the discrete component from the dynamic release tape.

2. The method of claim 1 in which at least a portion of the flexible support layer is free-standing when the discrete component assembly is positioned on the discrete component support fixture.

3. The method of claim 1 in which positioning the discrete component assembly on the discrete component support fixture includes positioning the flexible support layer of the dynamic release tape directly on the support plate of the discrete component support fixture.

4. The method of claim 1 in which positioning the discrete component assembly on the discrete component support fixture includes mounting a wafer ring of the discrete component assembly on the support frame of the discrete component support fixture.

5. The method of claim 1 further comprising adhering the discrete component to the dynamic release tape before positioning the discrete component.

6. The method of claim 1 further comprising adhering the discrete component to a component adhesion layer of the dynamic release structure.

7. The method of claim 1 further comprising adhering a wafer including the discrete component to the dynamic release tape.

8. The method of claim 7 in which adhering the wafer to the dynamic release tape includes adhering the wafer to a component adhesion layer of the dynamic release structure.

9. The method of claim 1 in which positioning the discrete component assembly on the discrete component support fixture includes attaching the dynamic release tape, including the discrete component, to the support plate of the discrete component support fixture.

10. The method of claim 9 in which positioning the discrete component assembly on the support plate includes holding the discrete component assembly on the support plate by application of a suction.

11. The method of claim 1 in which irradiating the dynamic release structure includes irradiating the dynamic release structure with light from the light source of the discrete component transfer system.

12. A discrete component transfer system comprising:
a light source;
a discrete component support fixture including (a) a support frame, and (b) a support plate positioned on the support frame, the support plate being transparent to light emitted by the light source, in which a top surface of the support plate is misaligned from a top surface of the support frame by an amount sufficient to introduce a tensile stress in a dynamic release tape held on the discrete component support fixture; and
an optical element disposed between the light source and the support frame.

13. The discrete component transfer system of claim 12 further comprising a suction source configured to apply a suction to an air flow channel of the discrete component support fixture to hold a flexible support layer of a discrete component assembly against the support plate,
wherein the discrete component assembly includes (a) the dynamic release tape including the flexible support layer and a dynamic release structure disposed on the flexible support layer, and (b) a discrete component adhered to the dynamic release tape.

14. The discrete component transfer system of claim 13 in which the air flow channel is formed through a thickness of the support frame.

15. The discrete component transfer system of claim 13 in which the air flow channel is formed through a thickness of the support plate.

16. The discrete component transfer system of claim 12 further comprising (a) the discrete component assembly including (i) a dynamic release tape including a flexible support layer, and (ii) a dynamic release structure disposed on the flexible support layer, and (b) a discrete component adhered to the dynamic release tape,
wherein the flexible support layer of the dynamic release tape is positioned directly on the support plate and held in place by suction through an air flow channel of the discrete component support fixture.

17. A discrete component transfer system comprising:
a light source;
a discrete component support fixture including (a) a support frame, and (b) a support plate positioned on the support frame, the support plate being transparent to light emitted by the light source;
a discrete component assembly disposed on the discrete component support fixture, the discrete component assembly including (a) a dynamic release tape including a flexible support layer and a dynamic release structure disposed on the flexible support layer, and (b) a discrete component adhered to the dynamic release tape, in which the dynamic release structure is configured such that the discrete component is released from the dynamic release tape responsive to irradiation of the dynamic release structure by the light source; and
an optical element disposed between the light source and the support frame,
wherein a top surface of the support plate is misaligned from a top surface of the support frame by an amount sufficient to introduce a tensile stress in the dynamic release tape held on the discrete component support fixture.

18. The discrete component transfer system of claim 17 in which the dynamic release tape is freestanding when the discrete component assembly is disposed on the discrete component support fixture.

19. The discrete component transfer system of claim 17 in which the discrete component assembly includes a wafer ring disposed on the discrete component support fixture.

\* \* \* \* \*

UNITED STATES PATENT AND TRADEMARK OFFICE
CERTIFICATE OF CORRECTION

| | |
|---|---|
| PATENT NO. | : 12,211,730 B2 |
| APPLICATION NO. | : 17/430553 |
| DATED | : January 28, 2025 |
| INVENTOR(S) | : Val Marinov and Yuriy Atanasov |

Page 1 of 1

It is certified that error appears in the above-identified patent and that said Letters Patent is hereby corrected as shown below:

In the Specification

In Column 1 Line 12, delete "both" and insert --both of--.

In the Claims

In Column 18 Line 10 (approx.), in Claim 16, delete "the" and insert --a--.

In Column 18 Line 11 (approx.), in Claim 16, delete second occurrence of "a" and insert --the--.

Signed and Sealed this
Twenty-seventh Day of May, 2025

Coke Morgan Stewart
*Acting Director of the United States Patent and Trademark Office*